United States Patent
Wang et al.

(10) Patent No.: US 8,022,534 B2
(45) Date of Patent: Sep. 20, 2011

(54) SEMICONDUCTOR PACKAGE USING AN ACTIVE TYPE HEAT-SPREADING ELEMENT

(75) Inventors: Tong Hong Wang, Selangor D.E (MY); Chang Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 91 days.

(21) Appl. No.: 12/408,118

(22) Filed: Mar. 20, 2009

(65) Prior Publication Data

US 2009/0250806 A1 Oct. 8, 2009

(30) Foreign Application Priority Data

Apr. 2, 2008 (TW) .............................. 97111988 A

(51) Int. Cl.
*H01L 23/34* (2006.01)

(52) U.S. Cl. ........ 257/712; 257/713; 257/724; 257/717; 257/720; 257/E23.051

(58) Field of Classification Search .................. 257/686, 257/707, 711, 712, 723–725, 730
See application file for complete search history.

(56) References Cited

U.S. PATENT DOCUMENTS

2008/0211088 A1* 9/2008 Sato .............................. 257/717

FOREIGN PATENT DOCUMENTS

TW 200620599 1/2007

* cited by examiner

*Primary Examiner* — Marcos D. Pizarro
*Assistant Examiner* — Eva Y. Montalvo
(74) *Attorney, Agent, or Firm* — Lowe, Hauptman, Ham & Berner, LLP

(57) ABSTRACT

A semiconductor package includes a carrier, a chip, a stiffener, a heat spreader and an active type heat-spreading element. The chip and the stiffener are disposed on the carrier. The heat spreader is disposed on the stiffener and includes a through opening. The active type heat-spreading element is disposed on the chip and located in the through opening.

19 Claims, 4 Drawing Sheets

SEMICONDUCTOR PACKAGE USING AN ACTIVE TYPE HEAT-SPREADING ELEMENT

CROSS REFERENCE TO RELATED APPLICATION

This application claims the priority benefit of Taiwan Patent Application Serial Number 097111988, filed Apr. 2, 2008, the full disclosure of which is incorporated herein by reference.

BACKGROUND OF THE INVENTION

1. Field of the Invention

The present invention generally relates to a package, and more particularly to a semiconductor package, wherein an active type heat-spreading element is not covered by a passive type heat-spreading element, whereby the heat of the chip can be directly conveyed to the environment located outside the semiconductor package via the active type heat-spreading element, and the weight of the passive type heat-spreading element cannot be transferred to the chip so as to decrease the pressure of the chip.

2. Description of the Related Art

As lighter and more complex electronic devices are required gradually, the processing speed and complexity of a chip is becoming more and more high. It is necessary that a semiconductor chip provides more leads for inputting and outputting signals. A ball grid array (BGA) package is a package which is widely used and has quantities of leads. Furthermore, as the density of elements on the semiconductor chip is increased, the heat resulted therefrom is increased gradually. Thus, there is another important problem how to effectively dissipate the heat resulted from the semiconductor chip.

Referring to FIG. 1, it depicts a conventional ball grid array (BGA) flip chip package 10. The package 10 includes a chip 30, a substrate 40, a heat spreader 12 and a stiffener 20. The chip 30 has an active surface 32, a back surface 34 and a plurality of bumps 36 disposed on the active surface 32. The substrate 40 is adapted to support the chip 30 and has a plurality of traces (not shown) electrically connected to the bumps 36 of the chip 30. The stiffener 20 is attached on the upper surface 26 of the substrate 40 by a first adhesive 42. The heat spreader 12 is attached on the stiffener 20 by a second adhesive 44. A thermally conductive material (TIM) 46 is disposed between the back surface 34 of the chip 30 and the heat spreader 10 for helpfully dissipating the heat resulted from the chip 30 during operation. A plurality of solder balls 22 are disposed on the lower surface 24 of the substrate 40.

However, this heat spreader 12 is a passive type heat-spreading element rather than an active type heat-spreading element. In other words, the heat spreader 12 dissipates the heat naturally and passively, but dose not dissipate the heat forcedly and actively by inputting the energy. Although the active type heat-spreading element needs to input the energy, the efficiency of heat dissipation of the active type heat-spreading element is higher than that of the passive type heat-spreading element.

Taiwan Patent Application Number 093138692 is filed on Dec. 14, 2004 (the application date). The applicant of this Taiwan patent application is same as that of the present application: Advanced Semiconductor Engineering, Inc. Referring to FIG. 2, this Taiwan patent application discloses a semiconductor package 100 including a carrier 110, a chip 120 and a thermoelectric cooler (TEC) 130. The chip 120 is disposed on the carrier 110 and electrically connected to the carrier 110 by bumps 180. The TEC 130 is disposed on the chip 120 and electrically connected to the carrier 110 by bumps 190. The semiconductor package 100 further includes an encapsulant 140 for mounting the chip 120 and the TEC 130 on the carrier 110. A plurality of solder balls 160 are disposed on the carrier 110.

The TEC 130 has first and second surfaces 132, 134. The temperature of the first surface 132 can be lower than that of the second surface 134 when the TEC 130 is energized. In other words, when the energy is inputted to the TEC 130, the first surface 132 is a surface which has a low temperature and absorbs the heat, and the second surface 134 is a surface which has a high temperature and dissipates the heat. The first surface 132 of the TEC 130 contacts the chip 120, and thus the TEC 130 can convey the heat generated by the chip 120 from the first surface 132 to the second surface 134 so as to achieve an objective of fast dissipating heat. The semiconductor package 100 further includes a passive type heat-spreading element 150, which covers and contacts the TEC 130 for conveying the heat of the second surface 134 of the TEC 130 to an environment located outside the semiconductor package 100.

However, the TEC 130 is covered by the passive type heat-spreading element 150, and thus the heat of the second surface 134 of the TEC 130 cannot be directly conveyed to the environment located outside the semiconductor package 100. In fact, the heat of the second surface 134 of the TEC 130 is indirectly conveyed to the environment located outside the semiconductor package 100 via the passive type heat-spreading element 150. Furthermore, the weight of the passive type heat-spreading element 150 presses on the chip 120 so as to increase the pressure of the chip 120.

Accordingly, there exists a need for a semiconductor package capable of solving the above-mentioned problems.

SUMMARY OF THE INVENTION

It is an object of the present invention to provide a semiconductor package, which can include an active type heat-spreading element and a passive type heat-spreading element simultaneously, wherein the active type heat-spreading element is not covered by the passive type heat-spreading element.

It is another object of the present invention to provide a semiconductor package, wherein the weight of the passive type heat-spreading element cannot be transferred to the chip.

In order to achieve the foregoing object, the present invention provides a semiconductor package including a carrier, a chip, a stiffener, a heat spreader and an active type heat-spreading element. The chip and the stiffener are disposed on the carrier. The heat spreader is disposed on the stiffener and includes a through opening. The active type heat-spreading element is disposed on the chip and located in the through opening. The heat spreader is a passive type heat-spreading element.

The semiconductor package of the present invention can include the active type heat-spreading element and the passive type heat-spreading element simultaneously, and the active type heat-spreading element is not covered by the passive type heat-spreading element, whereby the heat of the chip can be directly conveyed to the environment located outside the semiconductor package via the active type heat-spreading element so as to achieve an objective of fast dissipating heat.

The present invention further provides a semiconductor package further including a heat spreading fin assembly, a second thermal interface material and a third thermal interface material.

The weight of the passive type heat-spreading element (e.g. the heat spreader or the heat spreading fin assembly) of the semiconductor package of the present invention cannot be transferred to the chip so as to decrease the pressure of the chip. In addition, if the passive type heat-spreading element is pressed, the pressure of the passive type heat-spreading element cannot be transferred to t the chip.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
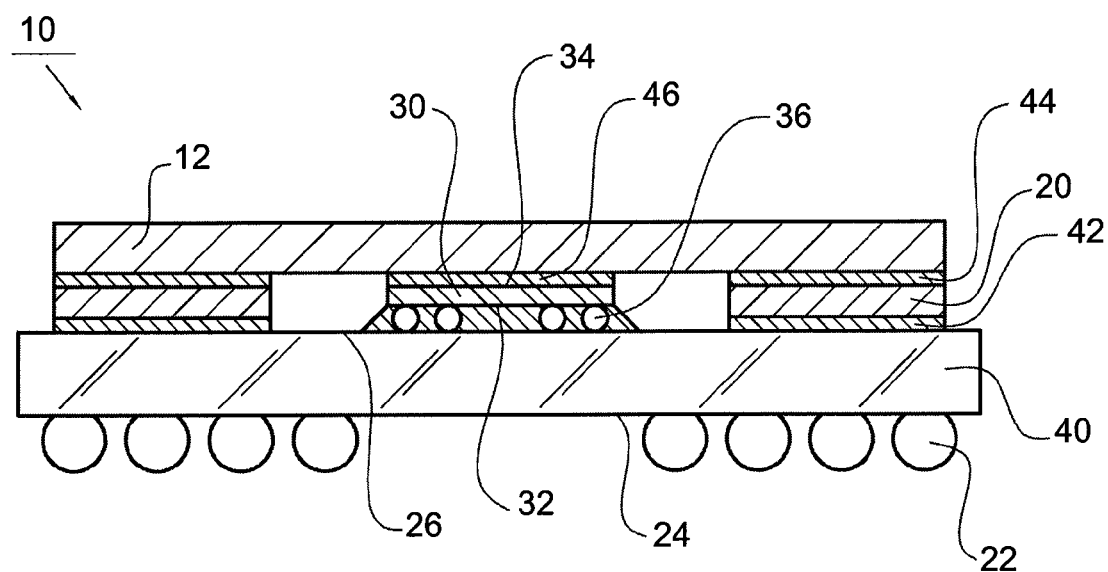
FIG. 1 is a cross-sectional view of a ball grid array (BGA) flip chip package in the prior art.
Figure 2:
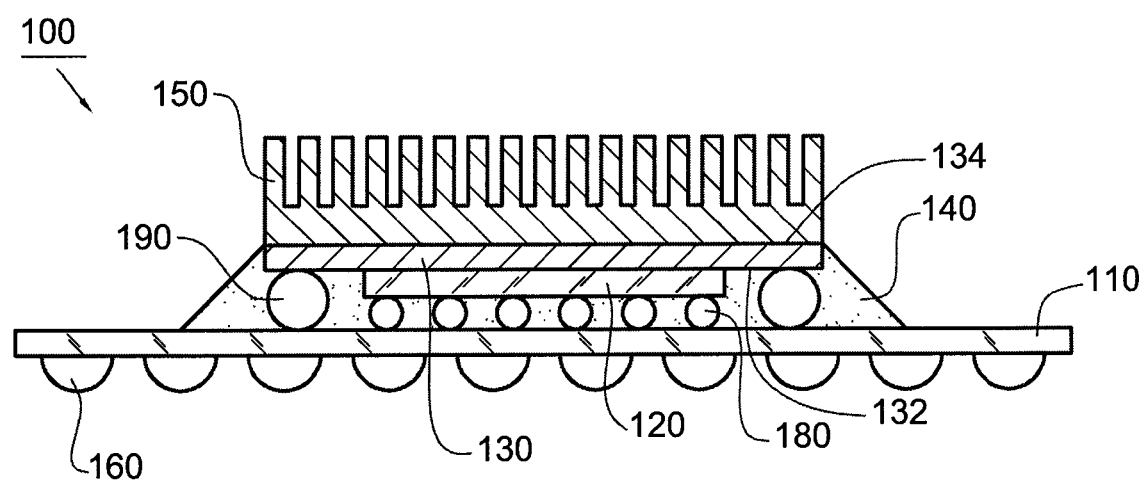
FIG. 2 is a cross-sectional view of a semiconductor package in the prior art.
Figure 3A:
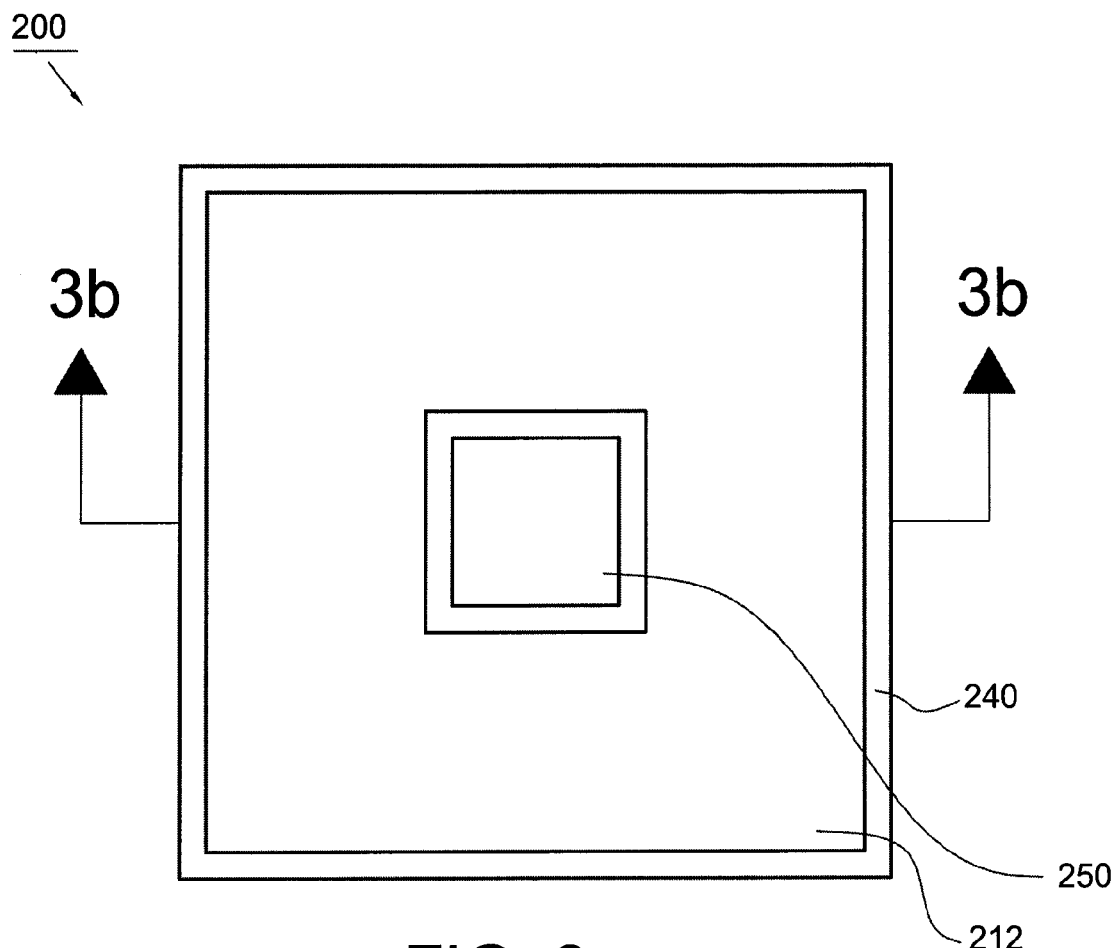
FIGS. 3a and 3b are plane and cross-sectional views of a semiconductor package according to the first embodiment of the present invention.
Figure 3B:
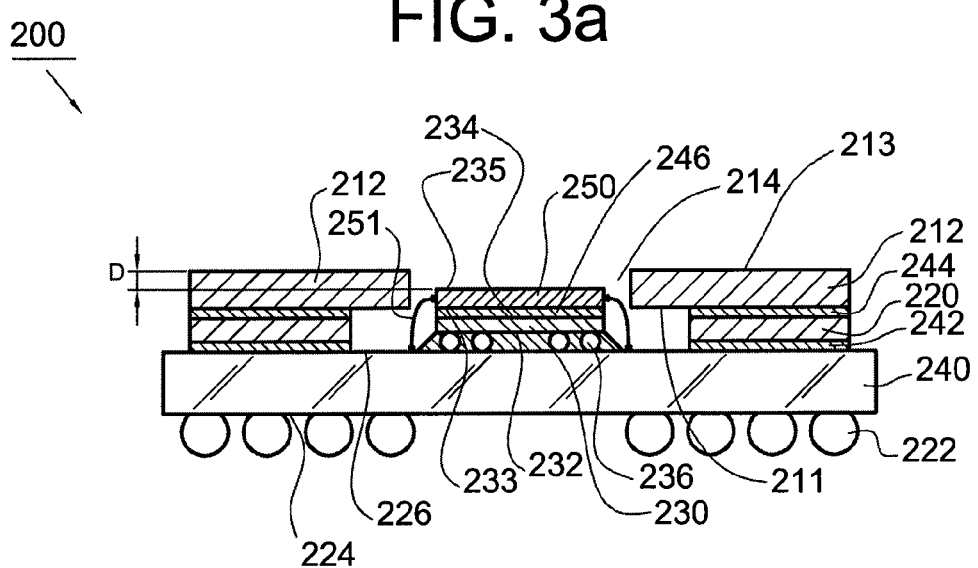

Referring to FIGS. 3a and 3b, they depict a semiconductor package 200 according to the first embodiment of the present invention. The semiconductor package 200 includes a carrier 240, a chip 230, a stiffener 220, a heat spreader 212 and an active type heat-spreading element 250. An active surface 232 of the chip 230 is disposed on an upper surface 226 of the carrier 240 (e.g. substrate or circuit board). An electrically conductive element (e.g. a plurality of bumps 236) is located on the active surface 232. The carrier 240 has a plurality of traces (not shown) electrically connected to the active surface 232 of the chip 230 by the bumps 236. A plurality of solder balls 222 are disposed on a lower surface 224 of the carrier 240.

Figure 4:
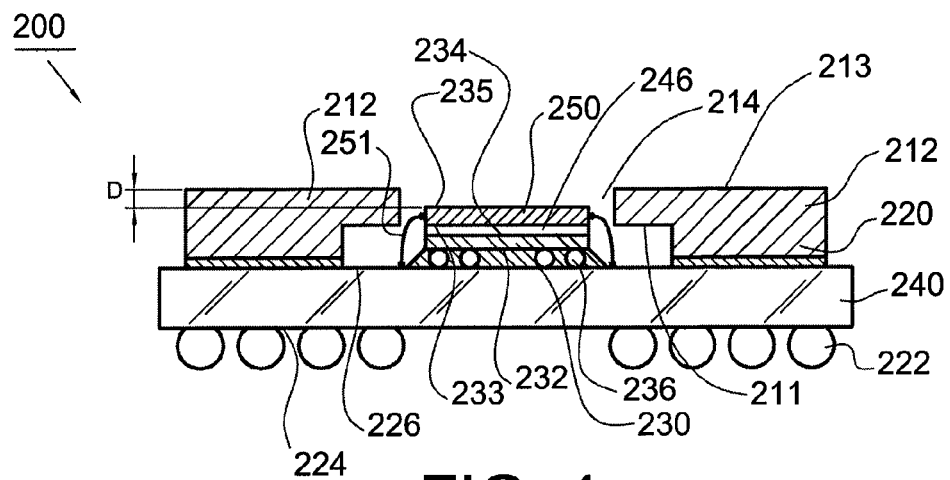
FIG. 4 is a cross-sectional view of a semiconductor package according to another embodiment of the present invention showing the heat spreader and the stiffener are integrally formed.

The stiffener 220 is disposed on the carrier 240. In this embodiment, the stiffener 220 can be attached on the carrier 240 by a first adhesive 242. The stiffener 220 surrounds the chip 230. The heat spreader 212 has a top surface 213 and a bottom surface 211, wherein the top surface 213 is opposite to the bottom surface 211. The heat spreader 212 is disposed on the stiffener 220. For example, the bottom surface 211 of the heat spreader 212 can be attached on the stiffener 220 by a second adhesive 244. The first adhesive 242 and second adhesive 244 can be made of material having thermal conductivity and stickiness. The heat generated by the chip 230 is conveyed to the heat spreader 212 through the carrier 240, the first adhesive 242, the stiffener 220 and the second adhesive 244. The heat spreader 212 is a passive type heat-spreading element, which dissipates the heat naturally and passively. In another embodiment, the heat spreader 212 and the stiffener 220 are integrally formed (shown in FIG. 4). The stiffener 220 become a part of the heat spreader 212 and is mounted on the carrier 240 by an adhesive process or a soldering process.

The active type heat-spreading element 250 is disposed on the back surface 234 of the chip 230 and located in a through opening 214 of the heat spreader 212. A first thermal interface material (TIM) 246 is disposed between the active type heat-spreading element 250 and the chip 230 for mounting the active type heat-spreading element 250 on the chip 230. The first TIM 246 can be a material having thermal conductivity and stickiness.

The active type heat-spreading element 250 dissipates the heat of the chip 230 forcedly and actively by inputting the energy. The active type heat-spreading element 250 can be a thermoelectric cooler (TEC). The TEC can be made of thermo-electric material, e.g. N-type semiconductor, P-type semiconductor, etc. In this embodiment, the TEC (i.e. active type heat-spreading element 250) can be electrically connected to the carrier 240 by wires 251 (shown in FIG. 3b) for inputting the energy to the TEC. The TEC has a bottom surface 233 and a top surface 235. The temperature of the bottom surface 233 can be lower than that of the top surface 235 when the TEC is energized. In other words, the bottom surface 233 is a surface which has a low temperature and absorbs the heat, and the top surface 235 is a surface which has a high temperature and dissipates the heat, when the energy is inputted to the TEC. The bottom surface 233 of the TEC contacts the chip 220, and thus the TEC can convey the heat generated by the chip 220 from the bottom surface 233 to the top surface 235 for conveying the heat of the top surface 235 of the TEC to an environment located outside the semiconductor package 200.

Furthermore, the top surface 213 of the heat spreader 212 is higher than of the top surface 235 of the active type heat-spreading element 250, i.e. there is a predetermined distance D between the top surface 213 of the heat spreader 212 and the top surface 235 of the active type heat-spreading element 250. If the heat spreader 212 is pressed, the pressure of the heat spreader 212 can be transferred to the carrier 240 rather than the active type heat-spreading element 250 and the chip 230, because of the predetermined distance D.

The semiconductor package of the present invention can include the active type heat-spreading element and the passive type heat-spreading element simultaneously, and the active type heat-spreading element is not covered by the passive type heat-spreading element, whereby the heat of the back surface of the chip can be directly conveyed to the environment located outside the semiconductor package via the active type heat-spreading element so as to achieve an objective of fast dissipating heat. In addition, if the passive type heat-spreading element (e.g. heat spreader) is pressed, the pressure of the passive type heat-spreading element cannot be transferred to the back surface of the chip.

Figure 5:
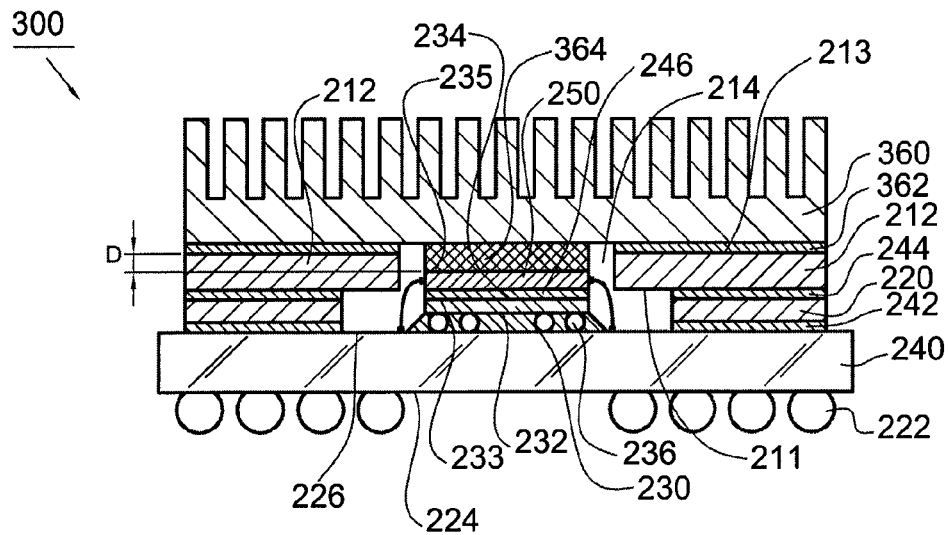
FIG. 5 is a cross-sectional view of a semiconductor package according to the second embodiment of the present invention.

Referring to FIG. 5, it depicts a semiconductor package 300 according to the second embodiment of the present invention. The semiconductor package 300 in the second embodiment is substantially similar to the semiconductor package 200 in the first embodiment, wherein the same elements are designated with the same reference numerals. The differences between the semiconductor packages 300, 200 is that the semiconductor package 300 further includes a heat spreading fin assembly 360, a second thermal interface material (TIM) 362 and a third thermal interface material (TIM) 364. The second TIM 362 is disposed between the heat spreader 212 and the heat spreading fin assembly 360 for mounting the heat spreading fin assembly 360 on the heat spreader 212. The second TIM 362 can be a material having thermal conductivity and stickiness. The third TIM 364 is disposed between the active type heat-spreading element 250 and the heat spreading fin assembly 360 for conveying the heat of the active type heat-spreading element 250 to the heat spreading fin assembly 360. The third TIM 364 can be a material having thermal conductivity and stickiness. For example, the third TIM 364 can be a thermal adhesive or a solder paste. The heat spreading fin assembly 360 is a passive type heat-spreading element, which dissipates the heat naturally and passively.

The top surface 213 of the heat spreader 212 is higher than the top surface 235 of the active type heat-spreading element 250, i.e. there is a predetermined distance D between the top surface 213 of the heat spreader 212 and the top surface 235 of the active type heat-spreading element 250. The predetermined distance D can be a buffer space between the active type heat-spreading element 250 and the heat spreading fin assembly 360. Thus, the weight of the heat spreading fin assembly 360 cannot be transferred to the active type heat-spreading element 250 but the heat spreader 212. The chip 230 is located under the active type heat-spreading element 250, and thus the weight of the heat spreading fin assembly 360 cannot be transferred to the chip 230 either so as to decrease the pressure of the chip 230. Furthermore, the active type heat-spreading element 250 is in the through opening 214 of the heat spreader 212. Thus, the weight of the heat spreader 212 cannot be transferred to the active type heat-spreading element 250 either, and further the weight of the heat spreader 212 cannot be transferred to the chip 230 either. In addition, if the heat spreading fin assembly 360 is pressed, the pressure of the heat spreading fin assembly 360 cannot be transferred to the active type heat-spreading element 250 but the heat spreader 212. Thus, the pressure of the heat spreading fin assembly 360 cannot be transferred to the chip 230.

The weight of the passive type heat-spreading element (e.g. the heat spreader or the heat spreading fin assembly) of the semiconductor package of the present invention cannot be transferred to the chip so as to decrease the pressure of the chip. In addition, if the passive type heat-spreading element is pressed, the pressure of the passive type heat-spreading element cannot be transferred to t the chip.

Figure 6:
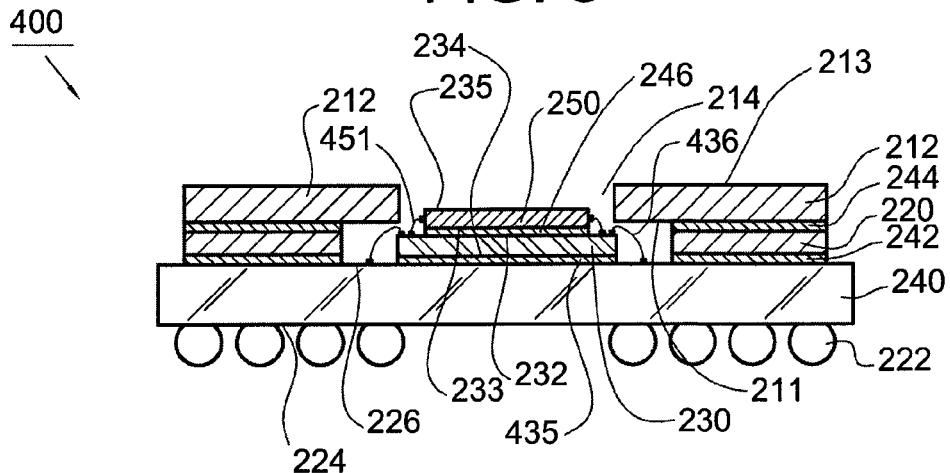
FIG. 6 is a cross-sectional view of a semiconductor package according to the third embodiment of the present invention.

Referring to FIG. 6, it depicts a semiconductor package 400 according to the third embodiment of the present invention. The semiconductor package 400 in the third embodiment is substantially similar to the semiconductor package 200 in the first embodiment, wherein the same elements are designated with the same reference numerals. The differences between the semiconductor packages 400, 200 is that the back surface 234 of the chip 230 of the semiconductor package 400 is disposed on the upper surface 226 of the carrier 240 by an adhesive 435. An electrically conductive element (e.g. a plurality of bonding wires 436) is adapted to electrically connect the carrier 240 to the active surface 232 of the chip 230. The active type heat-spreading element 250 is disposed on the active surface 232 of the chip 230 and located in the through opening 214 of the heat spreader 212. The thermoelectric cooler (i.e. the active type heat-spreading element 250) can be electrically connected to the chip 230 by bonding wires 451 for inputting the energy to the thermo-electric cooler.

The semiconductor package of the present invention can include the active type heat-spreading element and the passive type heat-spreading element simultaneously, and the active type heat-spreading element is not covered by the passive type heat-spreading element, whereby the heat of the active surface of the chip can be directly conveyed to the environment located outside the semiconductor package via the active type heat-spreading element so as to achieve an objective of fast dissipating heat. In addition, if the passive type heat-spreading element (e.g. heat spreader) is pressed, the pressure of the passive type heat-spreading element cannot be transferred to the active surface of the chip.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
 a carrier;
 a chip disposed on the carrier;
 a stiffener disposed on the carrier;
 a heat spreaders disposed on the stiffener and comprising a through opening; and
 an active type heat-spreading element disposed on the chip and located in the through opening,
 wherein the heat spreader and the active type heat-spreading element have a top surface respectively, and the top surface of the heat spreader is higher than the top surface of the active type heat-spreading element.

2. The semiconductor package as claimed in claim 1, wherein there is a predetermined distance between the top surface of the heat spreader and the top surface of the active type heat-spreading element.

3. The semiconductor package as claimed in claim 1, further comprising:
 a first thermal interface material disposed between the active type heat-spreading element and the chip.

4. The semiconductor package as claimed in claim 3, wherein the first thermal interface material is a material having stickiness.

5. The semiconductor package as claimed in claim 1, further comprising:
 a heat spreading fin assembly mounted on the heat spreader.

6. The semiconductor package as claimed in claim 5, further comprising:
 a second thermal interface disposed between the heat spreader and the heat spreading fin assembly.

7. The semiconductor package as claimed in claim 6, wherein the second thermal interface material is a material having stickiness.

8. The semiconductor package as claimed in claim 5, further comprising:
 a third thermal interface material disposed between the active type heat-spreading element and the heat spreading fin assembly.

9. The semiconductor package as claimed in claim 8, wherein the second thermal interface material is a material having stickiness.

10. The semiconductor package as claimed in claim 5, wherein both of the heat spreader and the heat spreading fin assembly are passive type heat-spreading elements.

11. The semiconductor package as claimed in claim 1, wherein the active type heat-spreading element is a thermoelectric cooler (TEC).

12. The semiconductor package as claimed in claim 1, wherein the active type heat-spreading element is electrically connected to one of the carrier and the chip.

13. The semiconductor package as claimed in claim 1, wherein the carrier is a circuit board.

14. The semiconductor package as claimed in claim 1, further comprising:
 an electrically conductive element adapted to electrically connect the chip to the carrier.

15. The semiconductor package as claimed in claim 1, wherein the stiffener surrounds the chip.

16. The semiconductor package as claimed in claim 1, further comprising:
- a first adhesive adapted to attached the stiffener on the carrier; and
- a second adhesive adapted to attached the heat spreader on the stiffener.

17. The semiconductor package as claimed in claim 1, wherein the heat spreader and the stiffener are integrally formed.

18. The semiconductor package as claimed in claim 17, wherein the stiffener is mounted on the carrier by an adhesive process or a soldering process.

19. The semiconductor package as claimed in claim 1, wherein the heat spreader and the chip do not overlap each other in a vertical direction.

* * * * *